US007092303B2

United States Patent
Ohlhoff

(10) Patent No.: US 7,092,303 B2
(45) Date of Patent: Aug. 15, 2006

(54) DYNAMIC MEMORY AND METHOD FOR TESTING A DYNAMIC MEMORY

(75) Inventor: Carsten Ohlhoff, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/478,441

(22) PCT Filed: May 13, 2002

(86) PCT No.: PCT/EP02/05244

§ 371 (c)(1),
(2), (4) Date: May 5, 2004

(87) PCT Pub. No.: WO02/095756

PCT Pub. Date: Nov. 28, 2002

(65) Prior Publication Data

US 2004/0233745 A1  Nov. 25, 2004

(30) Foreign Application Priority Data

May 22, 2001  (DE) ................. 101 25 022

(51) Int. Cl.
*G11C 29/00* (2006.01)
(52) U.S. Cl. ..................... 365/201; 365/222
(58) Field of Classification Search ........... 365/201, 365/222, 233

See application file for complete search history.

(56) References Cited

U.S. PATENT DOCUMENTS

| | | | | |
|---|---|---|---|---|
| 4,672,583 A | * | 6/1987 | Nakaizumi ............. | 365/222 |
| 4,827,476 A | * | 5/1989 | Garcia .................. | 714/728 |
| 5,321,661 A | * | 6/1994 | Iwakiri et al. ......... | 365/222 |
| 5,337,282 A | * | 8/1994 | Koike .................. | 365/222 |
| 5,703,823 A |   | 12/1997 | Douse et al. | |
| 5,831,918 A | * | 11/1998 | Merritt et al. ........ | 365/201 |
| 5,862,094 A | * | 1/1999 | Kawabata et al. ..... | 365/222 |
| 5,883,843 A |   | 3/1999 | Hii et al. | |
| 5,995,424 A |   | 11/1999 | Lawrence et al. | |
| 6,141,280 A |   | 10/2000 | Cho | |
| 6,392,948 B1 | * | 5/2002 | Lee ..................... | 365/222 |

FOREIGN PATENT DOCUMENTS

DE  199 04054 A1  12/1999

* cited by examiner

*Primary Examiner*—Vu A. Le
(74) *Attorney, Agent, or Firm*—Morrison & Foerster LLP

(57) ABSTRACT

The invention relates to a dynamic memory having a memory cell array, a test controller to test the memory cell array and an oscillator to control the refreshing of the memory cell array. According to the invention, the memory includes a device for using the oscillator as a time base for the test controller, such that a slow time base is achieved which may be used for different self-tests of the memory.

13 Claims, 1 Drawing Sheet

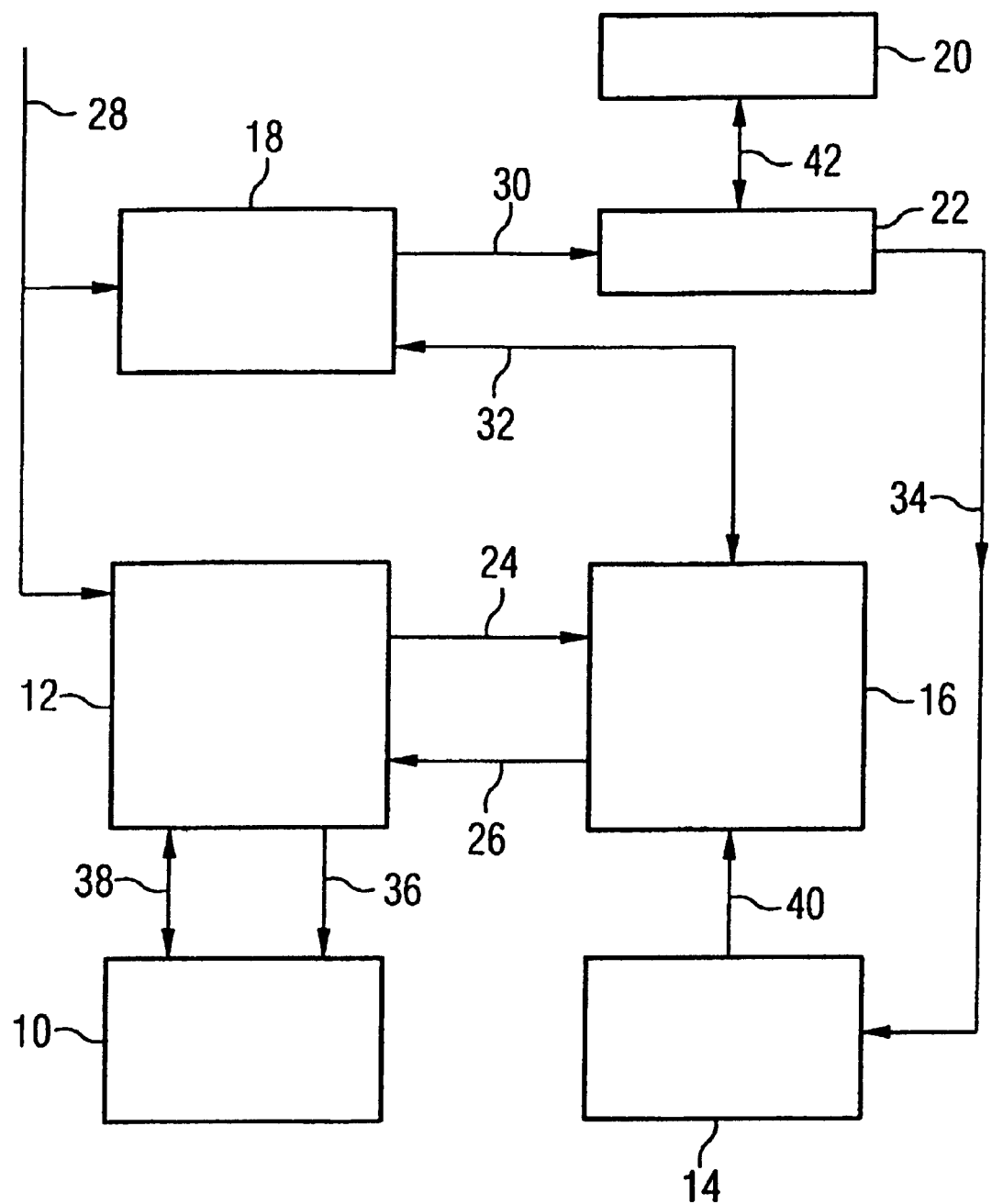

DYNAMIC MEMORY AND METHOD FOR TESTING A DYNAMIC MEMORY

CLAIM FOR PRIORITY

This application claims priority to PCT/EP02/05244, filed in the German language on May 13, 2002, which claims the benefit to German Application No. DE 101 25 022.3, filed in the German language on May 22, 2001.

TECHNICAL FIELD OF THE INVENTION

The invention relates to a dynamic memory and a method for testing a dynamic memory.

BACKGROUND OF THE INVENTION

As a rule, integrated circuits or chips are already tested at the wafer level, that is to say before being packaged. Such a test is particularly important in the case of semiconductor memories, in particular in the case of dynamic memories or DRAMS (Dynamic Random 15 Access memories), since individual failures of memory cells render the entire memory unusable. As the storage capacity in particular of the dynamic memories increases, the test times greatly increase and have come to give rise to a considerable proportion of the total production costs.

Since the production costs are a significant economic factor in the case of such standard products that are produced in high volumes, great efforts are undertaken to lower said production costs.

One approach consists in reducing the test times of dynamic memories. Another approach consists in testing a plurality of memories in parallel. The capacity of expensive production testers is better utilized as a result of this. Furthermore, the throughput during testing is increased.

A third approach takes a somewhat different direction: a special logic for testing is integrated on a dynamic memory and supports or even completely replaces the external tests. This is already known from the field of logic circuits, where so-called BIST (Built In Self Test) modules which serve for (self-) testing of the microprocessor are integrated for example on complex microprocessors. For this purpose, the BIST modules process test programs for testing individual modules of the processor. Functional test programs are predominantly used. The BIST modules generate the corresponding test patterns.

An external test is thus shorter or can sometimes even be omitted. In particular the number of signals made available by an external tester is thus considerably reduced. Moreover, such a component can also be tested during operation without an external automatic test machine.

For a complete self-test, a test controller or a BIST module must be able to control timings. As a rule, this does not pose any problems for functional tests since the requisite frequencies typically lie in the MHz range. As time base, a chip with such an integrated test controller utilizes an external oscillator clock applied to the chip.

However, this method poses problems in dynamic memories. This is because the latter require in part very slow oscillator clocks for a complete self-test. Such clocks have hitherto been provided by special oscillators which are present in the production testers and which can be programmed independently and asynchronously by the temporal control of the actual test patterns. However, precisely these slow time bases dominate the test time. As a result, a production tester is required for longer. The test throughput is reduced accordingly.

The periodic refresh of the memory cells in functional tests shall be mentioned here as an example of a test sequence of a dynamic memory which requires a particularly slow time base. Further examples are the measurement of the retention time of individual memory cells or the so-called bump test. Each of these tests requires a slow time base in the microseconds or even milliseconds time range.

SUMMARY OF THE INVENTION

The present invention proposes a dynamic memory and a method for testing a dynamic memory which enable even lengthy test sequences to be carried out by a test controller integrated in the dynamic memory.

The invention is based on the insight that an oscillator which at least some dynamic memories have and which controls the refresh of the memory cell array during standard operation of the memory is suitable as time base for a test controller contained on the dynamic memory, since refresh operations periodically occur at time intervals of a few microseconds, milliseconds or even seconds. By virtue of the "slow" time base of the oscillator in relation to functional tests of logic, the test controller can thereby control test sequences which to date have only been able to be carried out by production testers on account of a "slow" clock not present on the dynamic memory.

In apparatus terms, a dynamic memory having a memory cell array, a test controller for testing the memory cell array, and an oscillator for controlling a refresh of the memory cell array has a unit for utilizing the oscillator as time base for the test controller.

The unit may comprise a counter, which counts clock cycles in the output signal of the oscillator and, after a predetermined number of clock cycles, transmits at least one interrupt to the test controller. As a result, a signal which occurs at relatively long time intervals, in particular of microseconds or even milliseconds, is available to the test controller via the interrupt.

The predetermined number of clock cycles is preferably to stored in a programmable register. This enables a change in the time base for the test controller via a reprogramming. In principle, different time bases can be set as a result, depending on the desired test sequence. As an alternative, the frequency of the oscillator can be set by a programmable register. This essentially amounts to the same thing, namely a change in the time base. The advantages therefore remain essentially the same.

The counter may be designed in such a way that precisely one interrupt is generated. In this case, the oscillator is utilized as it were as a trigger. At a specific point in time, the test controller preferably initiates counting of the clock cycles contained in the output signal of the oscillator, for example in order to measure the retention time of memory cells of the memory cell array. As soon as an interrupt arrives, which is generated by the counter, the test controller detects that the retention time has elapsed and can measure the content of the memory cells of the memory cell array.

As an alternative, the counter can also generate interrupts periodically, preferably whenever the counter reading corresponds to an integer multiple of the predetermined number of clock cycles. This embodiment is suitable in particular for periodic testing, for example if the retention time of specific memory cells of the memory cell array is to be measured a number of times in succession.

In a preferred embodiment, the test controller is designed in such a way that, when an interrupt arrives, it carries out a refresh operation of the memory cell array (refresh mode) or continues an interrupted test program (voltage measuring mode). Internal voltages can be altered, for example, during an interrupted test program. The content of the memory cells can subsequently be measured in the context of the continued test program. As a result, it is possible to test the voltage dependence of the memory cells and other circuit elements of the dynamic memory.

The invention's method for testing a dynamic memory which comprises a memory cell array, a test controller for testing the memory cell array and an oscillator for controlling a refresh of the memory cell array is distinguished by the fact that at least one signal for controlling a test operation of the memory cell array by the test controller is generated from the output signal of the oscillator.

Preferably, clock cycles are counted in the output signal of the oscillator and, after a predetermined number of clock cycles, at least one interrupt is then generated and transmitted to the test controller. As a result, the dynamic memory no longer relies on external interrupts generated for example by a production tester. As a result, "slow", i.e. temporally lengthy tests can be carried out by the memory itself. Further advantages are that the external production tester does not have to be provided with a timer, and the number of pins of the dynamic memory which have to be contact-connected for the test is reduced since there is no need to provide a specific pin for feeding in external interrupts for test purposes. The length of time for which the services of an external production tester are required is now reduced, as a result of which the throughput of memories to be tested can be increased.

The predetermined number of clock cycles may be set in a manner dependent on the test sequence to be carried out. This is advantageous in particular when the memory is to carry out a maximum bandwidth of different tests, in particular test with different time bases. As an example, the refresh or voltage dependence test shall be mentioned, which requires a very "slow" time base. In contrast thereto, functional tests of logic included on the memory generally require "fast" time bases. A changeover of the time base can be performed very simply through the setting of the predetermined number of clock cycles.

Preferably, an interrupt has the effect that clock cycles are again counted at the output signal of the oscillator and a further interrupt is generated when the predetermined number of clock cycles is reached. This leads to periodic generation of interrupts with a period corresponding to the time duration prescribed by the predetermined number of clock cycles. By way of example, this can advantageously be used for repeating specific pattern sequences of a test a number of times.

Finally, in a preferred embodiment, an interrupt in the test controller has the effect that a refresh of the memory cell array is started or an interrupted test program is continued. In the first case, the interrupt serves as it were as refresh clock, and in the second case it serves for ending the interruption of a test program during which, for example, the voltage dependence of specific modules of the memory was measured.

After the arrival of a first interrupt, the test controller can interrupt a test program that is running and then start a retention or bump test. During these tests, preferably internal electric voltages on the memory cell array are altered. After the arrival of a second interrupt, the test controller can continue the interrupted test program. The latter can then read the memory cell array, for example, and ascertain which memory cells have lost their stored data on account of the alterations to the electric voltages.

BRIEF DESCRIPTION OF THE DRAWINGS

An exemplary embodiment of the invention will now be explained below with reference to the drawing, in which:

FIG. 1 shows a block diagram of a dynamic memory in which the oscillator is used for controlling a refresh of the memory cell array for test purposes according to the invention.

DETAILED DESCRIPTION OF THE INVENTION

The dynamic memory illustrated has a memory cell array 10. Also provided are a BIST test controller 12 for executing self-tests, an oscillator 14 for controlling the refresh of the memory cell array 10, a programmable counter 16, programmable registers 18, a fuse bank 20 and fuse latches 22.

As a rule, the oscillator 14, more precisely its oscillation frequency, is set, as it were calibrated, to a specific target frequency during a production test of the dynamic memory for the later normal operation. This is done by means of the fuse bank 20 and the fuse latches 22. For this purpose, a correction of the oscillation frequency of the oscillator 14, which correction may be necessary and is ascertained during a memory test, is stored as binary value during the production test in the fuse bank 20. The latter preferably comprises electrically programmable fuses which are in part "blown" by means of high current intensities during the memory test in accordance with the desired correction. However, it is also possible to use so-called "laser fuses", as is true nowadays in the majority of cases in industry. The electrical fuses have the advantage that the BIST can perform the trimming itself and can store the result immediately itself on the chip.

During normal operation, the fuse bank 20 is read via the bi-directional fuse bus 42, which also serves for writing to the fuse bank 20; the read-out content is stored in the fuse latches 22. The latter are in turn read by the oscillator 14 via the uni-directional frequency correction bus 34. The oscillator 14 thereupon correspondingly sets its oscillation frequency to the correction value stored in the fuse bank 20.

The (programmable) test controller 12 serves for carrying out self-tests of the dynamic memory. The latter can be carried out both during a production test of the memory and during later normal operation. The programming of the test controller 12 can be effected for example from a read-only memory (ROM) (not illustrated) which may likewise be integrated on the dynamic memory as a dedicated module or, alternatively, be provided externally. In the case of an external read-only memory which includes self-test programs for the dynamic memory, the test controller 12 accesses the read-only memory via the test program bus 28. Equally the test controller 12 can be programmed via a suitable programming interface in accordance with the standard IEEE Std. 1149.1

During a self-test, the test controller 12 generates control signals on the memory control bus 36 for driving the memory cell array 10 and writes or reads data to or from the memory cell array 10 via the bidirectional memory data bus 38. A typical test program sequence begins, for example, with the writing of test data, for example the pattern "10101010 . . . ", to the memory cell array 10. After the memory cell array 10 has been completely written to, the test controller reads out the written test data again and checks whether the values read out correspond to the values previously written in. In the case of non-correspondence, the test controller outputs a signal which signals a failure of the dynamic memory. These are so-called functional tests of the memory since only the function of the components included on the memory is tested.

In order to carry out more lengthy tests, the test controller 12 requires a "slow" time base. The latter is available to the test controller in the form of the oscillator 14, which is actually intended for controlling the refresh of the cell array 10. The output signal 40 of the oscillator 14 is a clock signal with the oscillation frequency. The counter 16 serves for counting the clock cycles in the output signal 40. However, it is not in operation until the test controller 12 enables the counter 16 by means of a start signal 24. After enabling, the counter 16 starts to count the clock cycles in the output signal 40 and generates an interrupt 26 if the count reaches a pre-determined number of clock cycles, i.e. the count corresponds precisely to the predetermined number of clock cycles. With the interrupt 26, a time base which can be set to very large values via a corresponding programming of the counter 16 is available to the test controller 12.

The programming is effected via the programmable registers 18, into which the predetermined number of clock cycles can be set via the test program bus 28.

The counter 16 can read the programmable registers 18 via the bus 32. As an alternative, via the programmable registers 18, the fuse latches 22 can also be reprogrammed via the bus 30. This effects a change in the oscillation frequency of the oscillator 14.

Consequently, the time base which is derived from the oscillator 14 can thus be changed in two different ways: on the one hand via programming of the counter 16 and on the other hand via the reprogramming of the oscillation frequency of the oscillator 14 via the fuse latches 22.

The interrupt signal 26 of the counter 16 can be evaluated in various ways by the test controller: by way of example, the test controller can atop a running routine of a test program and jump to a different program routine in order to start a specific test subroutine there in a manner triggered by the interrupt 26. The test subroutine may, for example, effect a refresh of the memory cell array 10 or initiate a test of the voltage dependence of the memory cell array 10. In this case, the supply voltages of the memory cell array are increased or reduced until a further interrupt 26 of the counter 16 stops the alteration of the supply voltages and further tests the memory normally. A previously interrupted test program can also be continued by means of an interrupt 26. The abovementioned retention and bump tests can be carried out in particular between two temporally succeeding interrupts 26.

| List of reference symbols | |
|---|---|
| 10 | Memory cell array |
| 12 | Test controller |
| 14 | Oscillator |
| 16 | (Programmable) counter |
| 18 | (Programmable) registers |
| 20 | Fuse bank |
| 22 | Fuse latches |
| 24 | Start signal |
| 26 | Interrupt (signal) |
| 28 | Test program bus |
| 30 | Bus |
| 32 | Bus |
| 34 | Uni-directional frequency correction bus |
| 36 | Memory control bus |
| 38 | Memory data bus |
| 40 | (Oscillator) output signal |
| 42 | B-directional fuse bus |

What is claimed is:

1. A dynamic memory comprising:
a memory cell array;
a test controller to test the memory cell array, and an oscillator to control a refresh of the memory cell array, which has for a unit to utilize the oscillator as a time base for the test controller.

2. The dynamic memory as claimed in claim 1, wherein the unit comprises a counter, which counts clock cycles in an output signal of the oscillator and, after a predetermined number of clock cycles, transmits at least one interrupt to the test controller.

3. The dynamic memory as claimed in claim 2, wherein the predetermined number of clock cycles is stored in a programmable register.

4. The dynamic memory as claimed in claim 2, wherein a frequency of the oscillator is set by a programmable register.

5. The dynamic memory as claimed in claim 2, wherein the counter is designed such that one interrupt is generated.

6. The dynamic memory as claimed in claim 2, wherein the counter is designed such that an interrupt is generated when the counter reading of the counter reaches an integer multiple of the predetermined number of clock cycles.

7. The dynamic memory as claimed in claim 2, wherein the test controller is designed such that, when an interrupt arrives, it carries out a refresh operation of the memory cell array or continues an interrupted test program.

8. A method for testing a dynamic memory, which comprises a memory cell array, a test controller to test the memory cell array and an oscillator to control a refresh of the memory cell array, comprising generating at least one signal to control a test operation of the memory cell array by the test controller from the output signal of the oscillator.

9. The method as claimed in claim 8, wherein clock cycles are counted in the output signal of the oscillator and, after a predetermined number of clock cycles, at least one interrupt is generated and transmitted to the test controller.

10. The method as claimed in claim 9, wherein the predetermined number of clock cycles is set in a manner dependent on the test sequence to be carried out.

11. The method as claimed in claim 9, wherein an interrupt causes clock cycles are to be counted in the output signal of the oscillator and a further interrupt is generated when the predetermined number of clock cycles is reached.

12. The method as claimed in claim 8, wherein an interrupt in the test controller causes a refresh of the memory cell array to start or an interrupted test program is continued.

13. The method as claimed in claim 8, wherein after the arrival of a first interrupt, the test controller interrupts a test program that is running and starts a retention or bump test and, after the arrival of a second interrupt continues the interrupted test program.

* * * * *